United States Patent
Goto

(10) Patent No.: US 7,302,633 B2
(45) Date of Patent: Nov. 27, 2007

(54) LSI DESIGN SYSTEM, LOGIC CORRECTION SUPPORT EQUIPMENT, LOGIC CORRECTION SUPPORT METHOD USED THEREFOR, AND PROGRAM THEREFOR

(75) Inventor: Atsuko Goto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/514,977

(22) Filed: Sep. 5, 2006

(65) Prior Publication Data

US 2007/0067691 A1 Mar. 22, 2007

(30) Foreign Application Priority Data

Sep. 7, 2005 (JP) ............................. 2005-258634

(51) Int. Cl.
*H03M 13/00* (2006.01)
(52) U.S. Cl. .................... 714/799; 714/2; 714/6; 714/737; 714/700; 714/746
(58) Field of Classification Search .................... 714/2, 714/6, 737, 700, 799, 746; 716/16
See application file for complete search history.

(56) References Cited

U.S. PATENT DOCUMENTS

| 6,151,694 | A  | * | 11/2000 | Nozuyama .................. 714/724 |
| 6,766,473 | B2 | * | 7/2004  | Nozuyama ................... 714/33 |
| 6,769,107 | B1 | * | 7/2004  | Watkins ....................... 716/16 |
| 7,096,384 | B2 | * | 8/2006  | Nishioka et al. .............. 714/27 |
| 2005/0120324 | A1 |   | 6/2005  | Kanamaru |

FOREIGN PATENT DOCUMENTS

JP 2005-165681 A 6/2005

* cited by examiner

*Primary Examiner*—Guy Lamarre
*Assistant Examiner*—Esaw Abraham
(74) *Attorney, Agent, or Firm*—Foley & Lardner LLP

(57) ABSTRACT

Logic correction support equipment supports logic correction of a logic circuit in LSI design for synthesizing a logic circuit from a register transfer level by logic synthesis. The logic correction support equipment finds a logic that was redundant before logic correction and becomes non-redundant after the logic correction by comparing redundant fault between the RTL before the logic correction and the RTL after the logic correction, and thereby supports manual correction of the logic circuit.

8 Claims, 9 Drawing Sheets

FIG. 2 module TOP1 (a, b, c, d, e, y1, y2);
input a, b, c, d, e;
output y1, y2;
wire t y1, y2;
y1=assign a|b;
t=assign~(d&e);
y2=assign ( (c&t) |~e);
endmodule

FIG. 3 module TOP1 (a, b, c, d, e, y1, y2);
input a, b, c, d, e;
output y1, y2;
SUB1 SUB1 (a, b, y1);
SUB2 SUB2 (d, e, t);
SUB3 SUB3 (c, t, e, y2);
endmodule module SUB1 (a, b, y1);
input a, b;
output y1;
y1=assign a|b;
endmodule module SUB2 (d, e, t);
input d, e;
output t;
t=assign~(d&e);
endmodule module SUB3 (c, t, e, y2);
input c, t, e;
output y2;
y2=assign ( (c&t) |~e);
endmodule

FIG. 5 module TOP1 (a, b, c, d, e, y1, y2);
input a, b, c, d, e;
output y1, y2;
wire t y1, y2;
y1=assign a|b;
t=assign~(d&e);
y2=assign ( (c&t) |~y1);
endmodule > WIRING OF e IS CHANGED TO WIRING OF y1

FIG. 6 module TOP1 (a, b, c, d, e, y1, y2);
input a, b, c, d, e;
output y1, y2;
SUB1 SUB1 (a, b, y1);
SUB2 SUB2 (d, e, t);
SUB3 SUB3 (c, t, y1, y2);
endmodule module SUB1 (a, b, y1);
input a, b;
output y1;
y1=assign a|b;
endmodule module SUB2 (d, e, t);
input d, e;
output t;
t=assign~(d&e);
endmodule module SUB3 (c, t, y1, y2);
input d, y1;
output t;
y2=assign ( (c&t) |~y1);
endmodule

LSI DESIGN SYSTEM, LOGIC CORRECTION SUPPORT EQUIPMENT, LOGIC CORRECTION SUPPORT METHOD USED THEREFOR, AND PROGRAM THEREFOR

BACKGROUND OF THE INVENTION

1. Field of the Invention

The present invention relates to a large scale integrated circuit (LSI) design system, logic correction support equipment, a logic correction support method used therefor, and a program therefor, and more specifically to a method for correcting an already synthesized logic circuit during LSI design.

2. Description of the Related Art

Conventionally, in designing an LSI, a given hardware specification is stepwise embodied in a more concrete form by a series of design processes consisting of a function design, a logic design, a circuit design, a layout design, etc. and finally the specification thus embodied is mapped into a mask pattern. In each design process, although the design is normally performed using a computer, the design is seldom done automatically only by a computer without human hands, and a system with a computer supporting manual design is employed.

In the function design among the design processes of an LSI, an operation synthesizer tool that converts an operation description expressing an operation of hardware to a description of a register transfer level (RTL) that will be an input of a logic synthesizer tool has been developed, and the use of such a tool makes it possible to drastically shorten a design time.

Moreover, in the logic design, the logic synthesizer tool for converting a description of the RTL into a logic circuit of gate level has been developed. When employing the logic synthesizer tool, the designer can set up several constraint conditions such as a chip area and a delay time. The layout design is one of the most automated design processes from its initial phase, and there has been developed an automated layout tool that, when macro cells and connection relations therebetween are inputted, arranges them on a chip and determines wiring paths among the macro cells.

In the conventional LSI design mentioned above, when, regarding a logic circuit synthesized from an RTL by logic synthesis, apart of the logic is intended to be altered, normally if the logic circuit is re-synthesized from the RTL, the whole of the circuit will be constrained to be altered although correction is only a part of the circuit. Then, the designer will inevitably correct the already synthesized logic circuit manually.

However, in the conventional LSI design, there may be a case where a logic that was erased in the LSI because of redundancy before logic correction will become non-redundant by the logic correction, as shown in FIG. 10. Since the redundant logic has already been erased in the synthesized logic circuit as shown in FIG. 11, it is therefore necessary to restore a portion that becomes non-redundant by the logic correction. In such a case, the conventional LSI design necessitates restoring this redundant logic; however, there is often the case where the existence of the redundant logic cannot be discovered and the logic correction becomes very difficult.

As a technique related to the present application, for example, Japanese Patent Laid-open Application (JP-A) No. 2005-165681 discloses a technique that addresses the problem. By this technique, a duplex circuit and a main circuit are integrated into one in the process of optimization of a circuit in LSI design. To solve this problem, the integrated circuit extracts output ports of the duplex circuit and of the main circuit from a net list, traces each extracted port down to the input side, and checks whether there is an overlap.

SUMMARY OF THE INVENTION

The object of the present invention is to provide an LSI design system capable of easily finding a logic that underwent insufficient correction when solving the above-mentioned problem and performing manual correction of the logic, logic correction support equipment, a logic correction support method used for them, and a program for the method.

The LSI design system according to this invention is an LSI design system that allows the logic correction support equipment to support logic correction of the logic circuit in LSI design for synthesizing a logic a circuit from a resister transfer level by logic synthesis, wherein the logic correction support equipment includes comparison means for comparing redundant fault of a register transfer level before the logic correction and redundant fault of the register transfer level after the logic correction and means for finding a logic that was redundant before the logic correction and becomes non-redundant after the logic correction based on the comparison result.

The logic correction support equipment according to this invention is logic correction support equipment that supports the logic correction of a logic circuit in LSI design for synthesizing a logic circuit from a register transfer level by logic synthesis. The logic correction support equipment includes comparison means for comparing redundant fault of a register transfer level before the logic correction and redundant fault of the register transfer level after the logic correction and means for finding a logic that was redundant before the logic correction and becomes non-redundant after the logic correction based on the comparison result.

The logic correction support method according to this invention is a logic correction support method used for an LSI design system that supports the logic correction support equipment to perform the logic correction of a logic circuit in LSI design for synthesizing a logic circuit from a register transfer level by logic synthesis, whereby the logic correction support equipment performs comparison processing of comparing redundant fault of a register transfer level before the logic correction and redundant fault of the register transfer level after the logic correction and processing of finding a logic that was redundant before the logic correction and becomes non-redundant after the logic correction based on the comparison result.

The program of the logic correction support method according to this invention is a program of the logic correction support method that is used in an LSI design system and supports the logic correction support equipment to perform the logic correction of a logic circuit in the LSI design for synthesizing a logic circuit from a register transfer level by logic synthesis, and that makes a computer of the logic correction support equipment perform processing of comparing redundant fault of a register transfer level before the logic correction and redundant fault of a register level after the logic correction and processing of finding a logic that was redundant before the logic correction and becomes non-redundant after the logic correction based on the comparison result.

That is, the logic correction support equipment of this invention is characterized by finding a logic that was redundant before the logic correction and becomes non-redundant after the logic correction by comparing redundant fault between the RTL before the logic correction and the RTL after the logic correction, so that manual correction of the logic circuit is supported.

Since, with the logic correction support equipment of this invention, it becomes possible to find a logic that was redundant before the logic correction and becomes non-redundant after the logic correction, the designer is enabled to perform the logic correction easily in a short time. The logic correction support equipment of this invention therefore makes it possible to easily find a logic that underwent insufficient correction when performing manual correction of the logic.

This invention attains an effect that the insufficiently corrected logic can easily be found when the designer manually corrects the logic by adopting a configuration and operations that will be described below.

BRIEF DESCRIPTION OF THE DRAWINGS

FIG. 2 is a diagram showing one example of an old RTL used in one embodiment of this invention;

FIG. 3 is a diagram showing one example of a hierarchical old RTL generated by a sentence-by-sentence hierarchization unit 1a of FIG. 1;

FIG. 5 is a diagram showing one example of a new RTL used in one embodiment of this invention;

FIG. 6 is a diagram showing one example of a hierarchical new RTL generated by a sentence-by-sentence hierarchization unit 1b of FIG. 1;

DETAILED DESCRIPTION OF THE PREFERRED EMBODIMENTS

Figure 1:
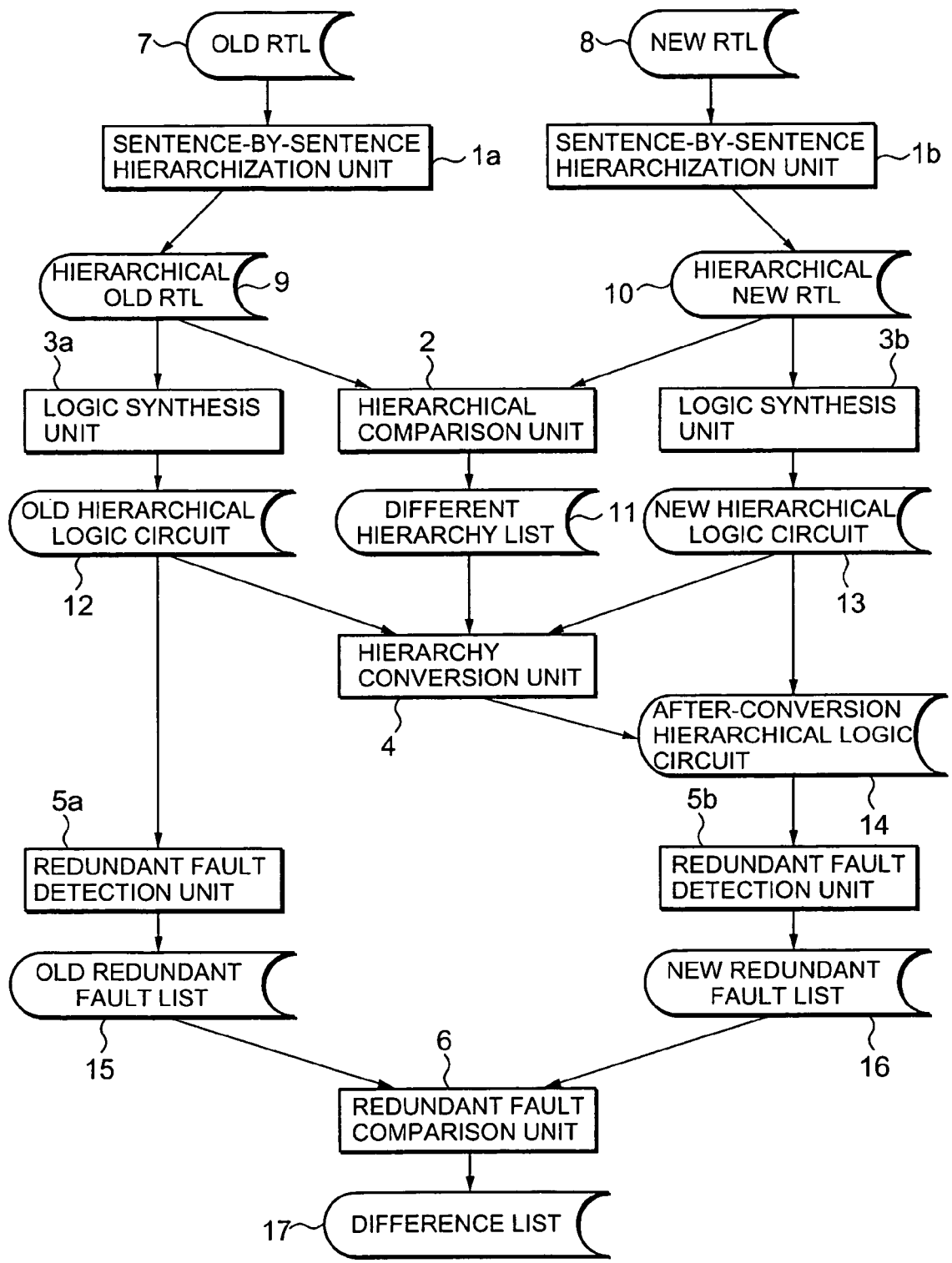
FIG. 1 is a block diagram showing a configuration of logic correction support equipment according to one embodiment of this invention.

Next, an embodiment of this invention will be described with reference to the drawings. FIG. 1 is a block diagram showing a configuration of logic correction support equipment according to one embodiment of this invention. In FIG. 1, the logic correction support equipment according to one embodiment of this invention consists of sentence-by-sentence hierarchization units 1a, 1b, a hierarchy comparison unit 2, logic synthesis units 3a, 3b, a hierarchy conversion unit 4, redundant fault detection units 5a, 5b, and a redundant fault comparison unit 6. Processing of the each unit of the logic correction support equipment according to one embodiment of this invention can also be realized by an unillustrated central processing unit (CPU) executing a program that a computer can execute.

Moreover, the logic correction support equipment according to one embodiment of this invention is used for an LSI design system that gradually concretizes a given hardware specification through design processes of a function design, a logic design, a circuit design, a layout design, etc. and finally converts it into a mask pattern. Each design process is the same as a counterpart of the conventional LSI design described above. Note that, also in this embodiment, the use of an operation synthesizer tool for converting an operation description expressing an operation of hardware into a description of a register transfer level (RTL) that will become an input to the logic synthesizer tool makes it possible to drastically shorten a design time in the function design among the LSI design processes.

The sentence-by-sentence hierarchization unit 1a generates a hierarchical old RTL 9 by hierarchically decomposing an old RTL 7, namely an RTL before logic correction, so that one sentence thereof may be on a single hierarchical level. Similarly, the sentence-by-sentence hierarchization unit 1b generates a hierarchical new RTL 10 by hierarchically decomposing a new RTL 8, namely an RTL after the logic correction, so that one sentence thereof may be on a single hierarchical level.

The hierarchy comparison unit 2 verifies whether an RTL logic description of the hierarchical new RTL 10 and an RTL logic description of the hierarchical old RTL 9 are equivalent to each other using a conventional logic equivalence tool for every hierarchical level, and registers a hierarchical level where the two are not equivalent in a different hierarchy list 11. The logic synthesis unit 3a generates an old hierarchical logic circuit 12 by logic-synthesizing the hierarchical old RTL 9 while information of the hierarchical level is maintained. Similarly, the logic synthesis unit 3b generates a new hierarchical logic circuit 13 by logic-synthesizing the hierarchical new RTL 10 while information of the hierarchical level is maintained.

The hierarchy conversion unit 4 generates an after-conversion hierarchical logic circuit 14 by replacing a circuit that is included in the new hierarchical logic circuit 13 and is of a hierarchical level not listed in the different hierarchy list 11 with a partial circuit of the same hierarchical level of the old hierarchical logic circuit 12. The redundant fault detection unit 5a prepares an old redundant fault list 15 of the old hierarchical logic circuit 12. Similarly, the redundant fault detection unit 5b prepares a new redundant fault list 16 of the after-conversion hierarchical logic circuit 14. The redundant fault comparison unit 6 compares the old redundant fault list 15 and the new redundant fault list 16, detects a difference of them, and outputs a difference list 17.

Figure 4:
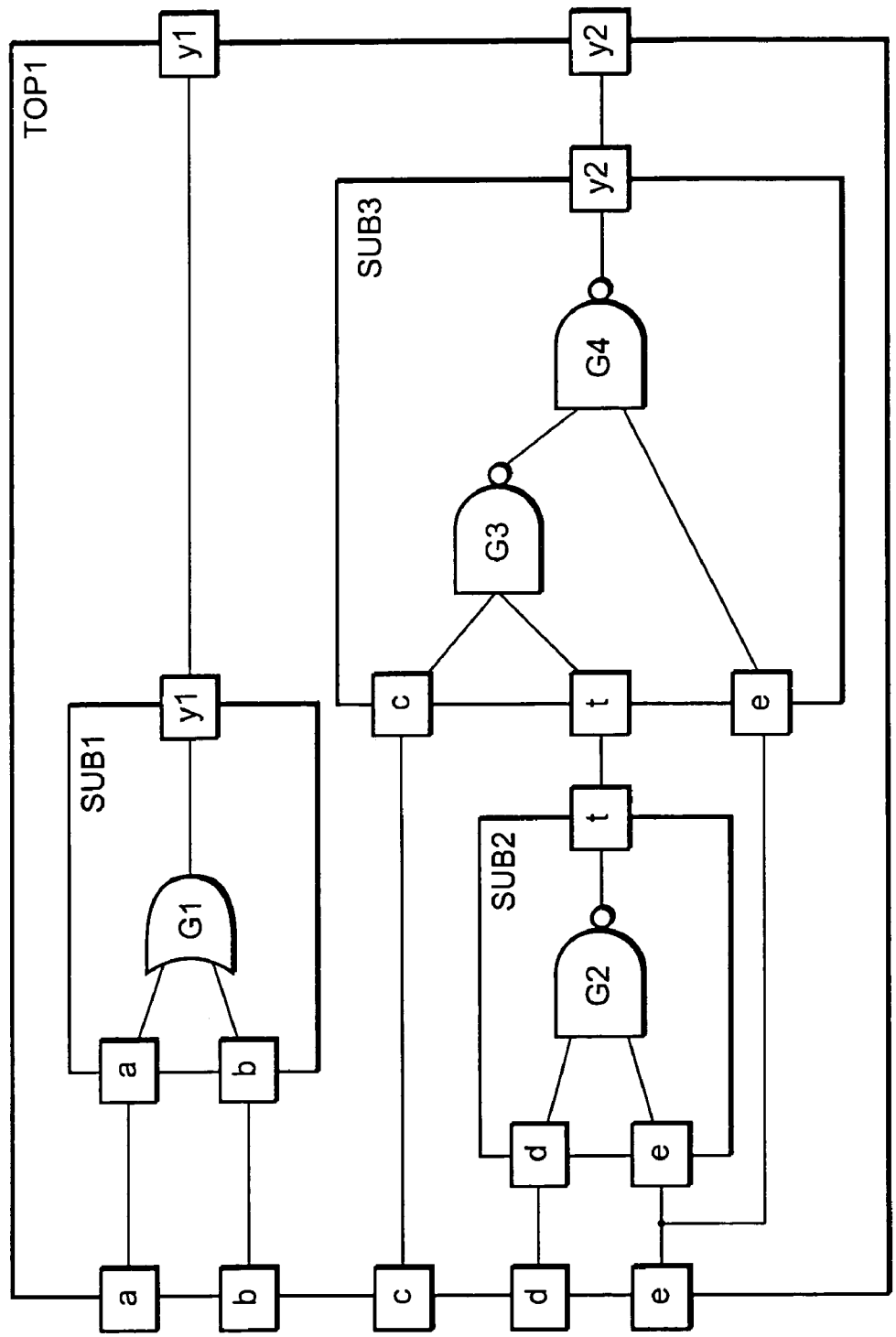
FIG. 4 is a diagram showing one example of an old hierarchical logic circuit synthesized from the hierarchical old RTL by a logic synthesis unit 3a of FIG. 1.

FIG. 2 is a diagram showing one example of the old RTL 7 used in one embodiment of this invention, FIG. 3 is a diagram showing one example of the hierarchical old RTL 9 generated by the sentence-by-sentence hierarchization unit of FIG. 1, and FIG. 4 is a diagram showing one example of the old hierarchical logic circuit 12 synthesized from the hierarchical old RTL 9 by the logic synthesis unit 3a of FIG. 1.

Figure 7:
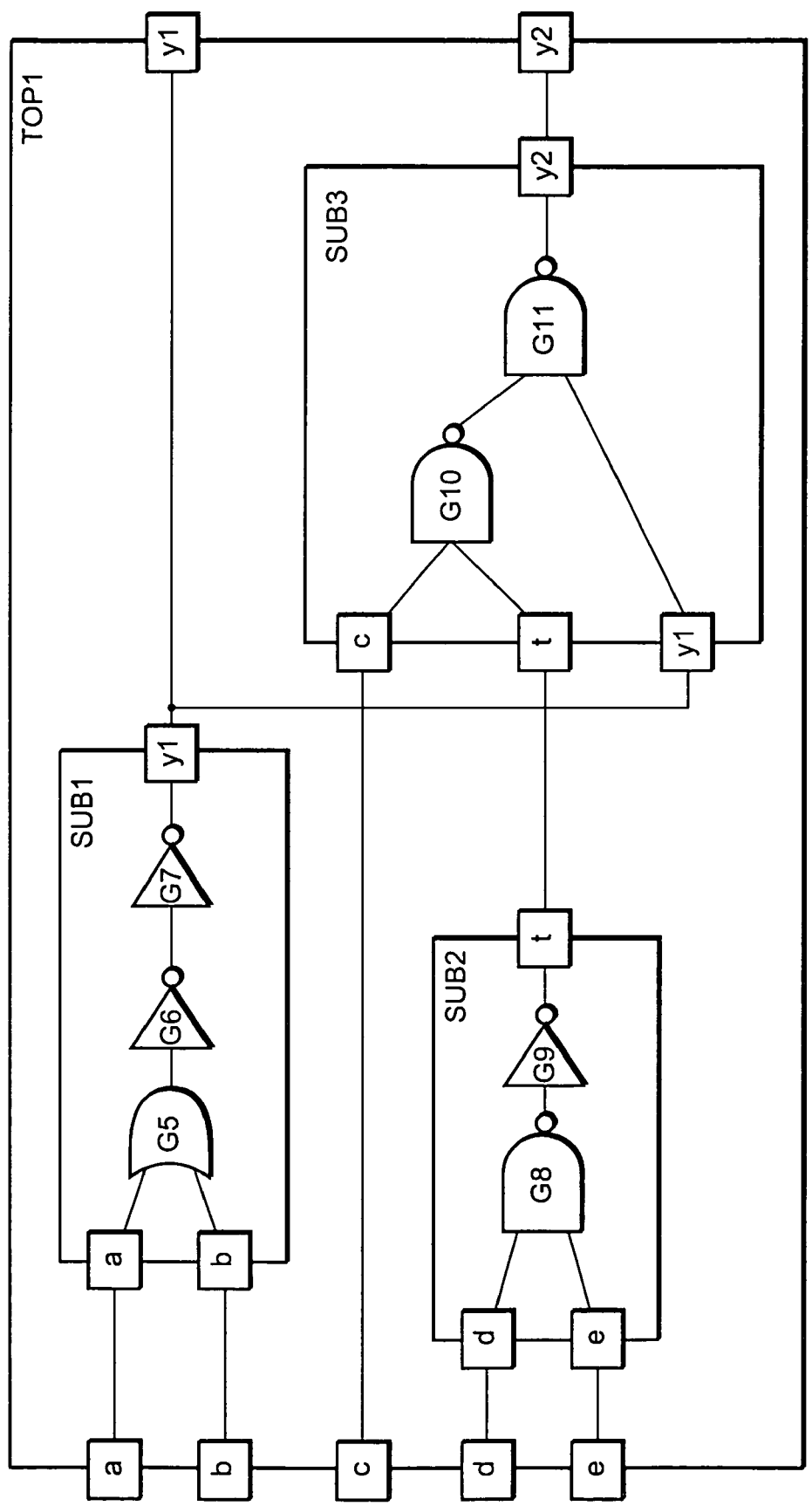
FIG. 7 is a diagram showing one example of a new hierarchical logic circuit 13 synthesized from the hierarchical new RTL by a logic synthesis unit 3b of FIG. 1.

FIG. 5 is a diagram showing one example of the new RTL 8 used in one embodiment of this invention, FIG. 6 is a diagram showing one example of the hierarchical new RTL 10 generated by the sentence-by-sentence hierarchization unit 1b of FIG. 1, and FIG. 7 is a diagram showing one example of the new hierarchical logic circuit 13 synthesized from the hierarchical new RTL 10 by the logic synthesis unit 3b of FIG. 1.

Figure 8:
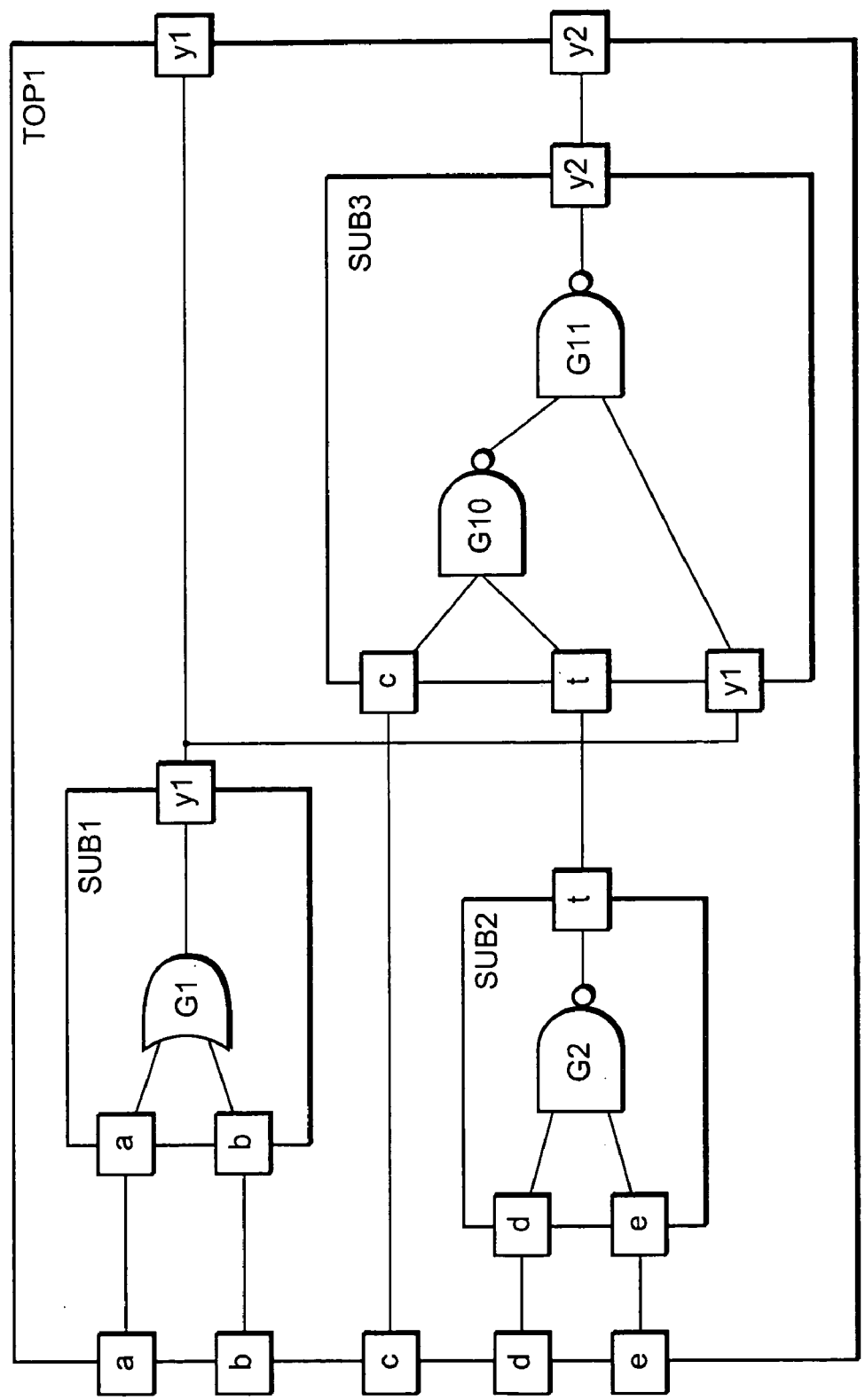
FIG. 8 is a diagram showing one example of an after-conversion hierarchical logic circuit that is converted by the hierarchy conversion unit of FIG. 1.
Figure 9:
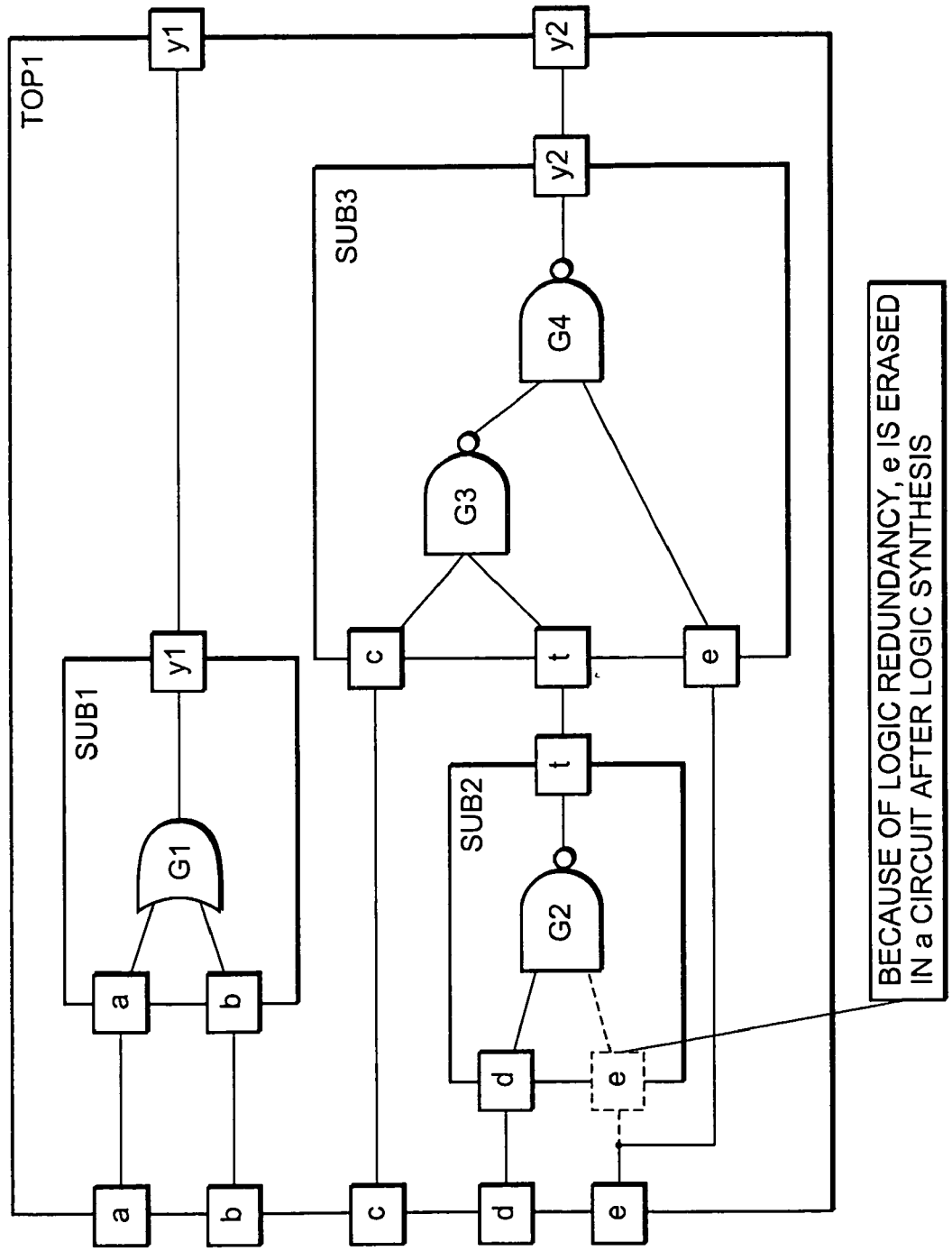
FIG. 9 is a diagram showing an example of a portion of the old hierarchical logic circuit of FIG. 1 registered in the old redundant fault list.
Figure 10:
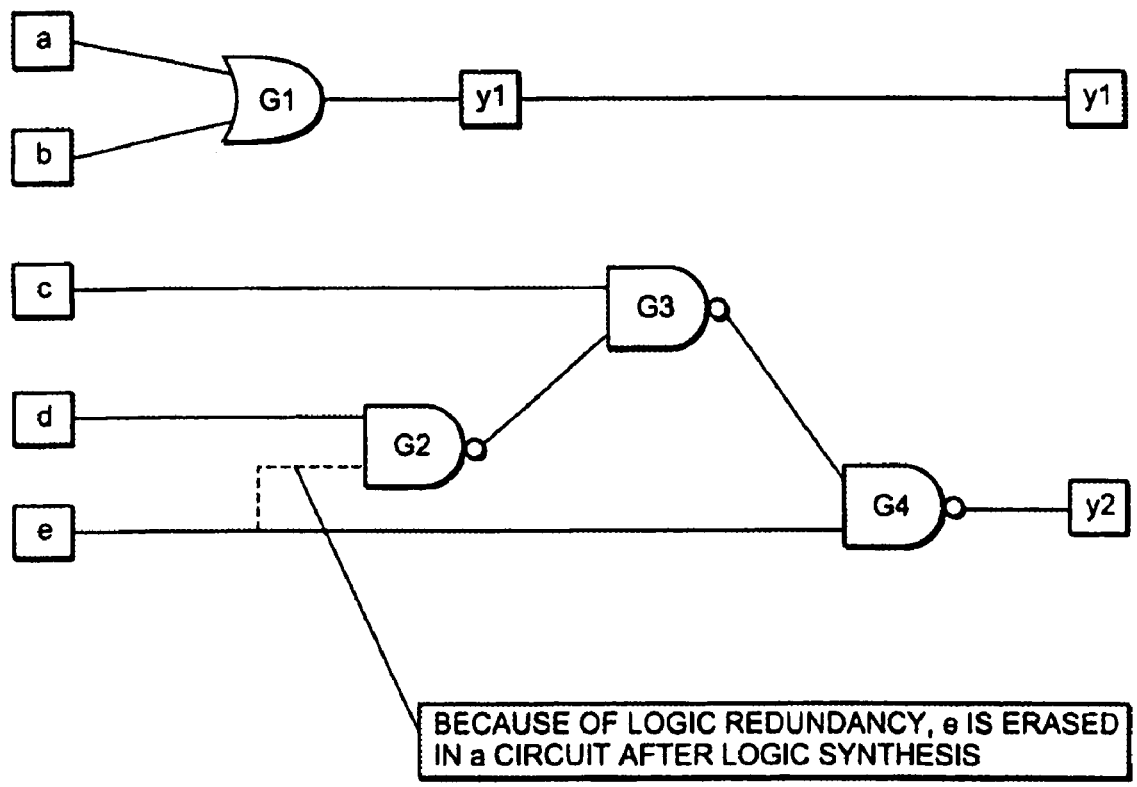
FIG. 10 is a diagram for explaining a problem of the conventional LSI design.
Figure 11:
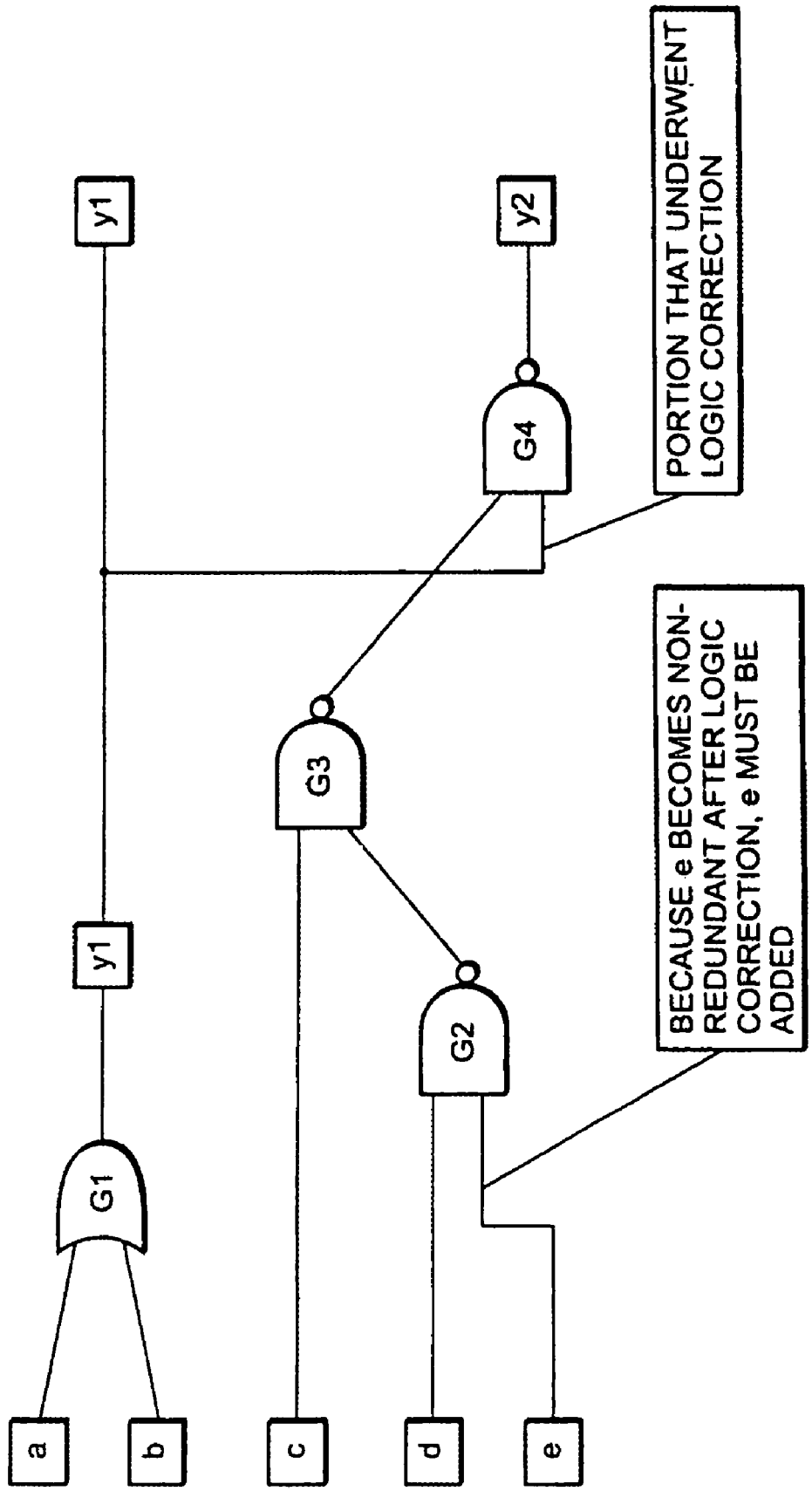
FIG. 11 is a diagram for explaining a problem of the conventional LSI design.

FIG. 8 is a diagram showing one example of the after-conversion hierarchical logic circuit 14 that underwent conversion in the hierarchy conversion unit 4 of FIG. 1; FIG. 9 is a diagram showing an example of a portion of the old hierarchical logic circuit 12 of FIG. 1 that is registered in the old redundant fault list 15. With reference to these FIGS. 1 to 9, operations of the logic correction support equipment according to one embodiment of this invention will be explained. In FIG. 4 and FIGS. 7 to 9, reference symbols a-e denote input ports, y1 and y2 denote output ports, t denotes a relaying port, and G1-G11 denote logic elements.

The sentence-by-sentence hierarchization unit 1a generates the hierarchical old RTL 9 shown in FIG. 3 by hierarchically decomposing the old RTL 7 shown in FIG. 2, as an input, so that one sentence thereof may be on a single hierarchical level. At this time, the sentence-by-sentence hierarchization unit 1a also outputs a signal connection relation between each low order hierarchy and other hierarchical levels as connections among hierarchical levels (TOP, shown in FIG. 3).

If the old RTL 7 is the following, as shown in FIG. 2,
module TOP1 (a, b, c, d, e, y1, y2);
input a, b, c, d, e;
output y1, y2;
wire t y1, y2;
y1=assign a|b;
t=assign~(d&e);
y2=assign((c&t)|~e);
endmodule the hierarchical old RTL 9 will become the following, as shown in FIG. 3.
module TOP1 (a, b, c, d, e, y1, y2);
input a, b, c, d, e;
output y1, y2;
SUB1 SUB1 (a, b, y1);
SUB2 SUB2 (d, e, t);
SUB3 SUB3 (c, t, e, y2);
endmodule
module SUB1 (a, b, y1);
input a, b;
output y1;
y1=assign a|b;
endmodule
module SUB2 (d, e, t);
input d, e;
output t;
t=assign~(d&e);
endmodule
module SUB3 (c, t, e, y2);
input c, t, e;
output y2;
y2=assign((c&t)|~e);
endmodule Similarly as the above, the sentence-by-sentence hierarchization unit 1b generates the hierarchical new RTL 10 shown in FIG. 6 by hierarchically decomposing the new RTL 8 shown in FIG. 5, as an input, so that one sentence thereof may be on a single hierarchical level. If the new RTL 8 is the following as shown in FIG. 5,
module TOP1 (a, b, c, d, e, y1, y2);
input a, b, c, d, e;
output y1, y2;
wire t y1, y2;
y1=assign a|b;
t=assign~(d&e);
y2=assign((c&t)|~y1);
endmodule the hierarchical new RTL 10 becomes the following as shown in FIG. 6.
module TOP1 (a, b, c, d, e, y1, y2);
input a, b, c, d, e;
output y1, y2;
SUB1 SUB1 (a, b, y1);
SUB2 SUB2 (d, e, t);
SUB3 SUB3 (c, t, y1, y2);
endmodule
module SUB1 (a, b, y1);
input a, b;
output y1;
y1=assign a|b;
endmodule
module SUB2 (d, e, t);
input d, e;
output t;
t=assign~(d&e);
endmodule
module SUB3 (c, t, y1, y2);
input d, y1;
output t;
y2=assign (c&t)|~y1);
endmodule The hierarchy comparison unit 2 verifies whether an RTL logic description of the hierarchical old RTL 9 shown in FIG. 3 and an RTL logic description of the hierarchical new RTL 10 shown in FIG. 6 are equivalent to each other using the conventional logic equivalence tool for each hierarchical level where output signals of a low order hierarchy are the same, with the RTL logic descriptions being brought into correspondence by a signal name, and registers a hierarchical level where the two are not equivalent in the different hierarchy list 11. In this embodiment, a port corresponding to the input port e of a hierarchical level SUB3 shown in FIG. 3 does not exist in the SUB3 shown in FIG. 7, and accordingly logic inconsistency occurs in the hierarchical level of the SUB3, which will be registered in the different hierarchy list 11.

The logic synthesis unit 3a generates the old hierarchical logic circuit 12 by logic-synthesizing the hierarchical old RTL 9 while information of the hierarchical level is maintained. Similarly, the logic synthesis unit 3b generates the new hierarchical logic circuit 13 by logic-synthesizing the hierarchical new RTL 10 while information of the hierarchical level is maintained. FIG. 4 shows an example of a hierarchical logic circuit synthesized from the hierarchical old RTL 9 shown in FIG. 3 by the logic synthesis unit 3a. FIG. 7 shows an example of a hierarchical logic circuit synthesized from the hierarchical new RTL 10 shown in FIG. 6 by the logic synthesis unit 3b.

The hierarchy conversion unit 4 replaces a hierarchical level that is included in the logic circuit generated by the logic synthesis unit 3b but not listed in the different hierarchy list 11 with a logic circuit of the same hierarchical level of the logic circuit generated by the logic synthesis unit 3a. By this, for hierarchical level having no relationship to the logic correction, a hierarchical logic circuit that is the same as that of the old hierarchical level can be generated. In this embodiment, hierarchical levels other than the SUB3 shown in FIG. 7 are replaced with the same hierarchical levels shown in FIG. 4. FIG. 8 shows an example of the after-conversion hierarchical logic circuit 14 that was converted by the hierarchy conversion unit 4.

The redundant fault detection unit 5a prepares the old redundant fault list 15 of the old hierarchical logic circuit 12, and the redundant fault detection unit 5b prepares the new redundant fault list 16 of the after-conversion hierarchical logic circuit 14. In this embodiment, what is registered in the old redundant fault list 15 of the old hierarchical logic circuit 12 is a connection from the input port e shown in FIG. 4 to a logic G2 of a SUB2, as shown in FIG. 9. Moreover, there is no connection registered in the new redundant fault list 16 of the after-conversion hierarchical logic circuit 14.

The redundant fault comparison unit 6 detects a difference between the old redundant fault list 15 and the new redundant fault list 16 by comparing them. In this embodiment, the detected difference is a connection from the input port e to the logic G2 of the SUB2 shown in FIG. 9. Therefore, it is understood that, in order to correct a logic circuit synthesized from the old RTL 7 to be a logic circuit conforming with the new RTL 8, it is necessary to add a logic of a net that becomes non-redundant in terms of a connection from the input port e to the logic G2 of the SUB2, shown in FIG. 9, that corresponds to a difference detected by the redundant fault comparison unit 6, in addition to the correction of a connection from the input port e to a port f1 of the SUB3 shown in FIG. 9.

Thus, in this embodiment, a logic that was redundant before the logic correction and becomes non-redundant after the logic correction can be found easily, and consequently, a logic that underwent insufficient correction can easily be found in performing manual correction of the logic.

What is claimed is:

1. An LSI design system including logic correction support equipment for supporting logic correction of a logic circuit, said logic correction support equipment comprising:
    listing means that generates a first list of redundant faults of a register transfer level before the logic correction and a second list of redundant faults of the register transfer level after the logic correction; and
    finding means that finds a difference between the first list and the second list;
    wherein said listing means comprises:
        first hierarchical means that generates a hierarchical old register transfer level by hierarchically decomposing the register transfer level before said logic correction so that one sentence thereof may be on a single hierarchical level;
        first logic synthesis means that generates an old hierarchical logic circuit by logic-synthesizing the hierarchical old register transfer level while information of the hierarchical level is maintained;
        first detection means that detects and generates the first list of redundant faults of said old hierarchical logic circuit;
        second hierarchization means that generates a hierarchical new register transfer level by hierarchically decomposing the register transfer level after said logic correction so that one sentence thereof may be on a single hierarchical level;
        second logic synthesis means that generates a new hierarchical logic circuit by logic-synthesizing the hierarchical new register transfer level while information of the hierarchical level is maintained; and
        second detection means that detects and generates the second list of redundant faults of said new hierarchical logic circuit.

2. The LSI design system according to claim 1,
    wherein said listing means further comprises:
        means that verifies whether a logic description of said hierarchical old register transfer level and a logic description of said hierarchical new register transfer level are equivalent to each other for each hierarchical level and registers a hierarchical level where the two are not equivalent in a different hierarchy list; and
        means for generating an after-conversion hierarchical logic circuit by replacing a circuit that is included in said new hierarchical logic circuit and is of a hierarchical level not listed in said different hierarchy list with a partial circuit of the same hierarchical level of said old hierarchical logic circuit,
    wherein said second detection means detects redundant faults of said after-conversion hierarchical logic circuit.

3. Logic correction support equipment for supporting logic correction of a logic circuit in LSI design, comprising:
    listing means that generates a first list of redundant faults of a register transfer level before the logic correction and a second list of redundant faults of the register transfer level after the logic correction; and
    finding means that finds a difference between the first list and the second list;
    wherein said listing means comprises:
        first hierarchization means that generates a hierarchical old register transfer level by hierarchically decomposing the register transfer level before said logic correction so that one sentence thereof may be on a single hierarchical level;
        first logic synthesis means that generates an old hierarchical logic circuit by logic-synthesizing the hierarchical old register transfer level while information of the hierarchical level is maintained;
        first detection means that detects and generates the first list of redundant faults of said old hierarchical logic circuit;
        second hierarchization means that generates a hierarchical new register transfer level by hierarchically decomposing the register transfer level after said logic correction so that one sentence thereof may be on a single hierarchical level;
        second logic synthesis means that generates a new hierarchical logic circuit by logic-synthesizing the hierarchical new register transfer level while information of the hierarchical level is maintained; and
        second detection means that detects and generates the second list of redundant faults of said new hierarchical logic circuit,
    wherein said comparison means compares a detection result of said first detection means and a detection result of said second detection means.

4. The logic correction support equipment according to claim 3, wherein said listing means further comprises:
    means that verifies whether a logic description of said hierarchical old register transfer level and a logic description of said hierarchical new register transfer level are equivalent to each other for each hierarchical level and registers a hierarchical level where the two are not equivalent; and
    means for generating the after-conversion hierarchical logic circuit by replacing a circuit that is included in said new hierarchical logic circuit and is of a hierarchical level not listed in said different hierarchy list with a partial circuit of the same hierarchical level of said old hierarchical logic circuit, wherein said second detection means detects redundant faults of said after-conversion hierarchical logic circuit.

5. A logic correction support method for supporting logic correction of a logic circuit in LSI design, comprising:

generating a first list of redundant faults of a register transfer level before logic correction and a second list of redundant faults of the register transfer level after the logic correction; and finding a difference between the first list and the second list;

wherein generating the first list and the second list comprises:

generating a hierarchical old register transfer level by hierarchically decomposing a register transfer level before said logic correction so that one sentence thereof may be on a single hierarchical level;

generating an old hierarchical logic circuit by logic-synthesizing the hierarchical old register transfer level while information of the hierarchical level is maintained;

detecting and generating the first list of redundant faults of said old hierarchical logic circuit;

generating a hierarchical new register transfer level by hierarchically decomposing a register transfer level after said logic correction so that one sentence thereof may be on a single hierarchical level;

generating a new hierarchical logic circuit by logic-synthesizing the hierarchical new register transfer level while information of the hierarchical level is maintained; and detecting and generating the second list of redundant faults of said new hierarchical logic circuit.

6. The logic correction support method according to claim 5, wherein generating the first list and the second list further comprises:

verifying whether a logic description of said hierarchical old register transfer level and a logic description of said hierarchical new register transfer level are equivalent to each other for each hierarchical level and registering a hierarchical level where the two are not equivalent in a different hierarchy list; and generating an after-conversion hierarchical logic circuit by replacing a circuit that is included in said new hierarchical logic circuit and is of a hierarchical level not listed in said different hierarchy list with a partial circuit of the same hierarchical level of said old hierarchical logic circuit, wherein redundant faults of said after-conversion hierarchical logic circuit are detected by the processing of detecting redundant fault of said new hierarchical logic circuit.

7. A computer readable recording medium storing a program for supporting logic correction of a logic circuit in LSI design that, when executed, performs a method comprising:

generating a first list of redundant faults of a register transfer level before logic correction and a second list of redundant faults of the register transfer level after the logic correction; and finding a difference between the first list and the second list;

wherein generating the first list and the second list comprises:

generating a hierarchical old register transfer level by hierarchically decomposing a register transfer level before said logic correction so that one sentence thereof may be on a single hierarchical level;

generating an old hierarchical logic circuit by logic-synthesizing the hierarchical old register transfer level while information of the hierarchical level is maintained;

detecting and generating the first list of redundant faults of said old hierarchical logic circuit;

generating a hierarchical new register transfer level by hierarchically decomposing a register transfer level after said logic correction so that one sentence thereof may be on a single hierarchical level;

generating a new hierarchical logic circuit by logic-synthesizing the hierarchical new register transfer level while information of the hierarchical level is maintained; and detecting and generating the second list of redundant faults of said new hierarchical logic circuit.

8. A computer readable recording medium according to claim 7, wherein generating the first list and the second list further comprises:

verifying whether a logic description of said hierarchical old register transfer level and a logic description of said hierarchical new register transfer level are equivalent to each other for each hierarchical level and registering a hierarchical level where the two are not equivalent in a different hierarchy list; and generating an after-conversion hierarchical logic circuit by replacing a circuit that is included in said new hierarchical logic circuit and is of a hierarchical level not listed in said different hierarchy list with a partial circuit of the same hierarchical level of said old hierarchical logic circuit, wherein redundant faults of said after-conversion hierarchical logic circuit are detected by the processing of detecting redundant fault of said new hierarchical logic circuit.

* * * * *